United States Patent
Zhang (10) Patent No.: US 11,557,480 B2
(45) Date of Patent: Jan. 17, 2023

(54) SEMICONDUCTOR STRUCTURE AND FABRICATION METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventor: Bin Zhang, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 271 days.

(21) Appl. No.: 17/077,292

(22) Filed: Oct. 22, 2020

(65) Prior Publication Data

US 2021/0159078 A1     May 27, 2021

(30) Foreign Application Priority Data

Nov. 26, 2019    (CN) .......................... 201911174539.8

(51) Int. Cl.
*H01L 21/033*    (2006.01)
(52) U.S. Cl.
CPC ...... *H01L 21/0338* (2013.01); *H01L 21/0332* (2013.01); *H01L 21/0335* (2013.01); *H01L 21/0337* (2013.01)

(58) Field of Classification Search
CPC ............. H01L 21/0332; H01L 21/0335; H01L 21/0337; H01L 21/0338
See application file for complete search history.

(56) References Cited

U.S. PATENT DOCUMENTS

2006/0199391 A1* 9/2006 Nakata ................ H01L 21/3088
257/E21.235

* cited by examiner

*Primary Examiner* — Walter H Swanson
(74) *Attorney, Agent, or Firm* — Anova Law Group, PLLC (57) ABSTRACT

Semiconductor devices and fabrication methods thereof are provided. The method may include forming a first sacrificial film on a to-be-etched layer having; and forming second sacrificial layers on the first sacrificial film. A first trench or a second trench is between adjacent second sacrificial layers; and a width of the second trench is greater than a width of the first trench. The method also includes forming a first sidewall spacer on a sidewall surface of a second sacrificial layer, a ratio between the width of the first trench and a thickness of the first sidewall spacer being greater than 2:1; and etching the first sacrificial film using the first sidewall spacer as an etching mask to form first sacrificial layers. A third trench or a second trench is between adjacent first sacrificial layers. The method also includes forming a second sidewall spacer to fill the third trench.

18 Claims, 8 Drawing Sheets

SEMICONDUCTOR STRUCTURE AND FABRICATION METHOD THEREOF

CROSS-REFERENCE TO RELATED APPLICATION

This application claims the priority of Chinese Patent Application No. 201911174539.8, filed on Nov. 26, 2019, the content of which is incorporated by reference in its entirety.

TECHNICAL FIELD

The present disclosure generally relates to the field of semiconductor manufacturing technology and, more particularly, relates to semiconductor structures and fabrication methods.

BACKGROUND

In the process of manufacturing semiconductor devices, a photolithography process is usually used to transfer patterns from a mask to a substrate. The photolithography process usually includes providing a semiconductor substrate; forming a photoresist layer on the semiconductor substrate; and exposing and developing the photoresist layer to form a patterned photoresist layer to allow the patterns on the mask to be transferred to the photoresist layer. The semiconductor substrate is etched using the patterned photoresist layer as an etching mask such that the patterns on the patterned photoresist layer are transferred to the semiconductor substrate. After transferring the patterns to the semiconductor substrate, the patterned photoresist layer may be removed.

As the size of semiconductor devices continues to shrink, the critical dimensions of the lithography process are gradually approaching or even exceeding the physical limits of photolithography, which poses more severe challenges to the lithography technology. To further reduce the size of semiconductor devices on the basis of the photolithography process, a multiple patterning process has be developed. Such a process has application prospects because of its ability to form a mask with a smaller size, and the unreachable limit of a single patterning process may be overcome.

However, there is a need to further improve the multiple patterning process. The disclosed methods and semiconductor structures are directed to solve one or more problems set forth above and other problems in the art.

SUMMARY

One aspect of the present disclosure provides a method for forming a semiconductor structure. The method may include providing a to-be-etched layer; forming a first sacrificial film on the to-be-etched layer; and forming a plurality of second sacrificial layers discrete to each other on the first sacrificial film. A first trench is between adjacent second sacrificial layers of the plurality of second sacrificial layers; a second trench is between adjacent second sacrificial layers of the plurality of second sacrificial layers; a width of the second trench is greater than a width of the first trench; and a width direction of the first trench and a width direction of the second trench are consistent with an arrangement direction of the plurality of second sacrificial layers. The method may also include forming a first sidewall spacer on a sidewall surface of a second sacrificial layer of the plurality of second sacrificial layers. A ratio between the width of the first trench and a thickness of the first sidewall spacer is greater than 2:1. Further, the method may include removing the plurality of second sacrificial layers; etching the first sacrificial film using the first sidewall spacer as an etching mask to form a plurality of first sacrificial layers discrete to each other. A third trench is between adjacent first sacrificial layers of the plurality of first sacrificial layers; a fourth trench is between adjacent second sacrificial layers of the plurality of first sacrificial layers; a width of the fourth trench is greater than a width of the third trench, and a width direction of the third trench and a width direction of the fourth trench are consistent with an arrangement direction of the plurality of first sacrificial layers. Further, the method may include forming a second sidewall spacer in the third trench to fill the third trench; and forming a third sidewall spacer on a sidewall surface of a first sacrificial layer of the plurality of first sacrificial layers.

Optionally, the to-be-etched layer may include a multiple-layer structure. The multiple layer structure may include a substrate, a mask structure on the substrate and a first stop layer on the mask structure.

Optionally, forming the plurality of second sacrificial layers may include forming a second stop layer on the first sacrificial film; forming a second sacrificial film on the second stop layer; forming a plurality of patterned structures discrete to each other on the second sacrificial film; etching the second sacrificial film using the plurality of patterned structures as an etching mask until the second stop layer is exposed to form the plurality of second sacrificial layers; and removing the plurality of patterned structures after forming the plurality of second sacrificial layers.

Optionally, forming the first sidewall spacer may include forming a first sidewall film on exposed portions of a top surface of the second stop layer, and sidewall surfaces and top surfaces of the plurality of second sacrificial layers; and etching-back the first sidewall film on the exposed portions of the top surface of the second stop layer and the top surfaces of the plurality of second sacrificial layers until the exposed portions of the top surface of the second stop layer and the top surfaces of the plurality of second sacrificial layers are exposed to form the first sidewall spacer.

Optionally, forming the first sidewall film may include an atomic layer deposition process.

Optionally, etching-back the first sidewall film may include one of an anisotropic dry etching process and an anisotropic wet etching process.

Optionally, a material of the first sidewall film includes one of silicon nitride and silicon oxynitride.

Optionally, forming the second sidewall spacer may include forming a second sidewall film on exposed portions of a top surface of the to-be-etched layer and sidewall surfaces and top surfaces of the plurality of first sacrificial layers; and etching the second sidewall film on a surface of the fourth trench and the top surfaces of the plurality of first sacrificial layers until the exposed portions of the top surface of the to-be-etched layer the top surface of the plurality of first sacrificial layers are exposed to form the second sidewall spacer.

Optionally, a ratio between the width of the third trench and a thickness of the second sidewall spacer is smaller than 2:1; and a ratio between the width of the fourth trench and the thickness of the second sidewall spacer is greater than 2:1.

Optionally, forming the second sidewall film includes an atomic layer deposition process.

Optionally, etching the second sidewall film includes one of an isotropic dry etching process and an isotropic wet etching process.

Optionally, a material of the second sidewall film includes silicon carbonitride.

Optionally, forming the third sidewall spacer may include forming a third sidewall film on exposed portions of a top surface of the to-be-etched layer, top surfaces and sidewall surfaces of the plurality of first sacrificial layers and a top surface of the second sidewall spacer; etching-back the third sidewall film on the exposed portions of the top surface of the to-be-etched layer, the top surfaces of the plurality of first sacrificial layers and the top surface of the second sidewall spacer to form the third sidewall spacer; and removing the plurality of first sacrificial layers and the second sidewall spacer after forming the third sidewall spacer.

Optionally, forming the third sidewall film may include an atomic layer deposition process.

Optionally, a material of the third sidewall film may include one of silicon nitride and silicon oxynitride.

Optionally, etching-back the third sidewall film may include one of an anisotropic dry etching process and an isotropic wet etching process.

Optionally, after forming the third sidewall spacer, the method may include etching the to-be-etched layer using the third sidewall spacer as an etching mask to form a plurality of fins discrete to each other.

Another aspect of the present disclosure provides a semiconductor structure formed by the disclosed method Other aspects or embodiments of the present disclosure can be understood by those skilled in the art in light of the description, the claims, and the drawings of the present disclosure.

The technical solutions of the present disclosure may have at least the following beneficial effects.

In the disclosed fabrication method, a ratio between the width of the first trench and the thickness of the first sidewall spacer may be greater than 2:1. The width of the first trench may be increased to decrease the width difference between the first trench and the second trench. Accordingly, the process requirement for forming the second sacrificial layer may be reduced; and the fabrication process may be simplified; and the production efficiency may be improved. By subsequently using the second sidewall spacer to fill the third trench and not to fill the fourth trench, the requirements for forming fins with different densities may be met.

Further, in the present disclosure, the third sidewall spacers may be used as an etching mask to etch the to-be-etched layer to form the plurality of fins. The plurality of fins may be subsequently used to form semiconductor devices.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts.

FIGS. 1-4 illustrate structures corresponding to certain stages during a fabrication process of a semiconductor structure.

Figure 1:
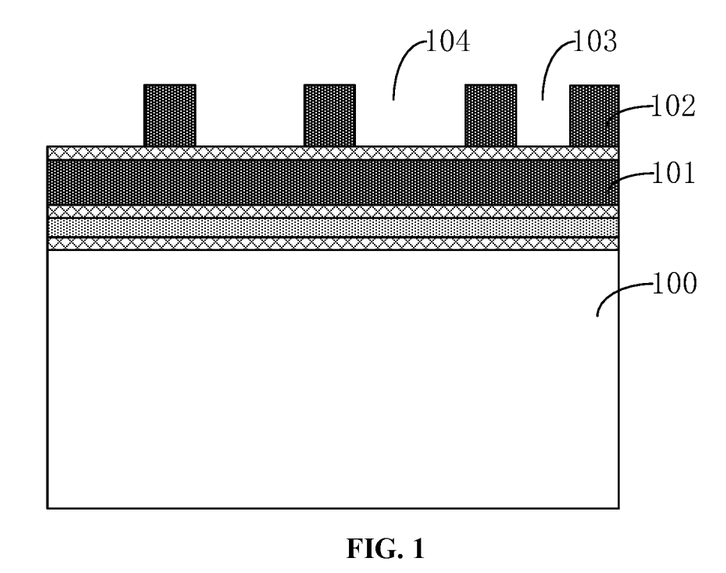
FIGS. 1-4 illustrate structures corresponding to certain stages during a fabrication process of a semiconductor structure.

As shown in FIG. 1, the fabrication process includes providing a to-be-etched layer 100, and forming a first sacrificial film 101 on the to-be-etched layer 100. Further, a plurality of discrete second sacrificial layers 102 and a plurality of sacrificial layer trenches are formed on the first sacrificial film 101. Each of the sacrificial layer trenches is located between two adjacent second sacrificial layers 102. The sacrificial layer trenches include a first trench 103 and a second trench 104. The width of the second trench 104 is greater than the width of the first trench 103.

Figure 2:
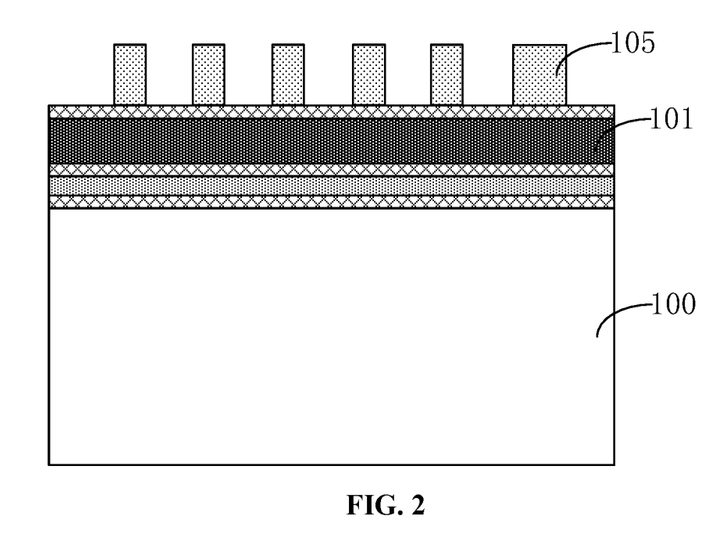

Further, as shown in FIG. 2, a first sidewall film (not shown) is formed on the exposed portions of the top surface of the to-be-etched layer 100, and the sidewall surfaces and top surfaces of the second sacrificial layers 102. Then, the first sidewall film on the surface of the second trench and the top surfaces of the second sacrificial layers 102 are etched back to form a plurality of first sidewall spacers 105. The ratio between the width of the first trench 103 and the thickness of the first sidewall spacer 105 is less than 2:1; and the ratio between the width of the second trench 104 and the thickness of the first sidewall spacer 105 is greater than 2:1. After forming the first sidewall spacers 105, the second sacrificial layers 102 are removed.

Figure 3:
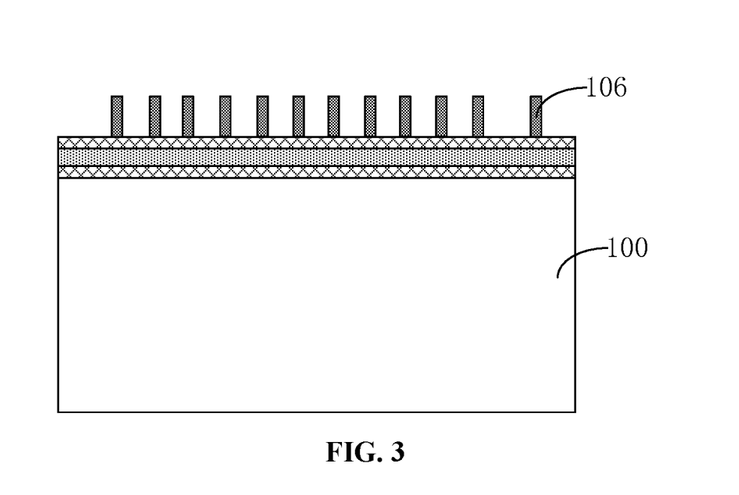

Further, as shown in FIG. 3, the first sacrificial film 101 is etched using the first sidewall spacers 105 as an etching mask to form a plurality of first sacrificial layers (not shown); and second sidewall spacers 106 are formed on the sidewall surfaces of the first sacrificial layers. After forming the second sidewall spacers 106, the first sacrificial layers are removed.

Figure 4:
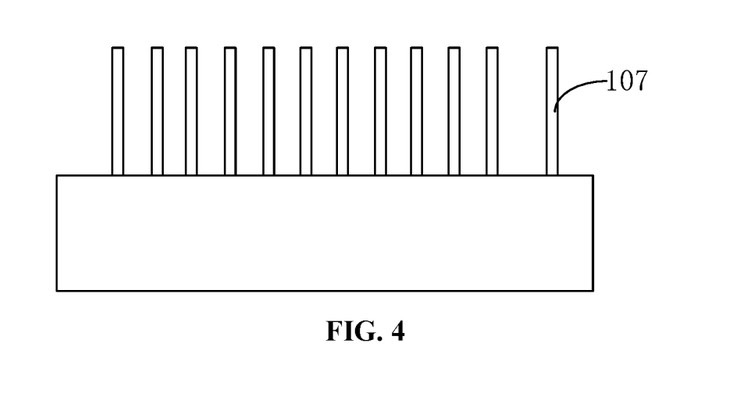

Further, as shown in FIG. 4, the to-be-etched layer 100 is etched using the second sidewall spacers 106 as an etching mask to form a plurality of discrete fins 107.

In the above fabrication method, to finally form the fins 107 with different densities, the first sidewall spacer 105 is used to fill the first trench 103, but the first sidewall spacer 105 is not formed in the second trench 104. However, to ensure that the first sidewall spacer 105 is filled in the first trench 103 and is not formed in the second trench 104, the width the first trench 103 is required to be significantly greater than the width of the second trench 104. That is, the distances between adjacent second sacrificial layers 102 are significantly different. However, the requirements for forming the second sacrificial layers 102 with relatively large distance differences are relatively high, and the manufacturing process is relatively complicated. Accordingly, the efficiency of forming the final semiconductor structures is reduced.

The present disclosure provides a semiconductor structure and a method for forming a semiconductor structure. By increasing the width of the first trench, the width difference between the first trench and the second trench may be reduced. Thus, the requirements of the formation of the second trench may be reduced; the fabrication process may be simplified; and the production efficiency may be increased. Subsequently, the third trench may be filled with the second sidewall spacer and the second sidewall spacer may not be formed in the fourth trench to meet the final requirement of forming fins with different densities.

To make the above-mentioned objects, features and advantages of the present disclosure more obvious and understandable, specific embodiments of the present disclosure will be described in detail below with reference to the accompanying drawings.

Figure 16:
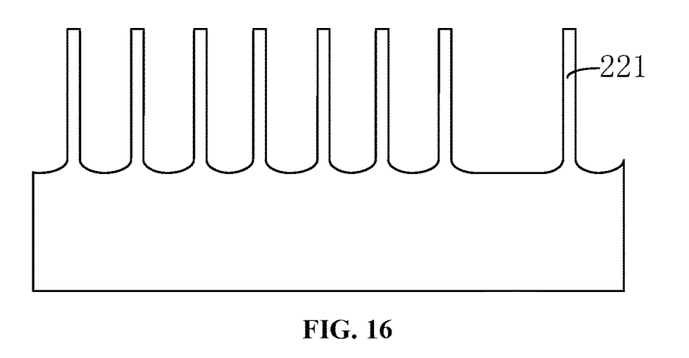
Figure 17:
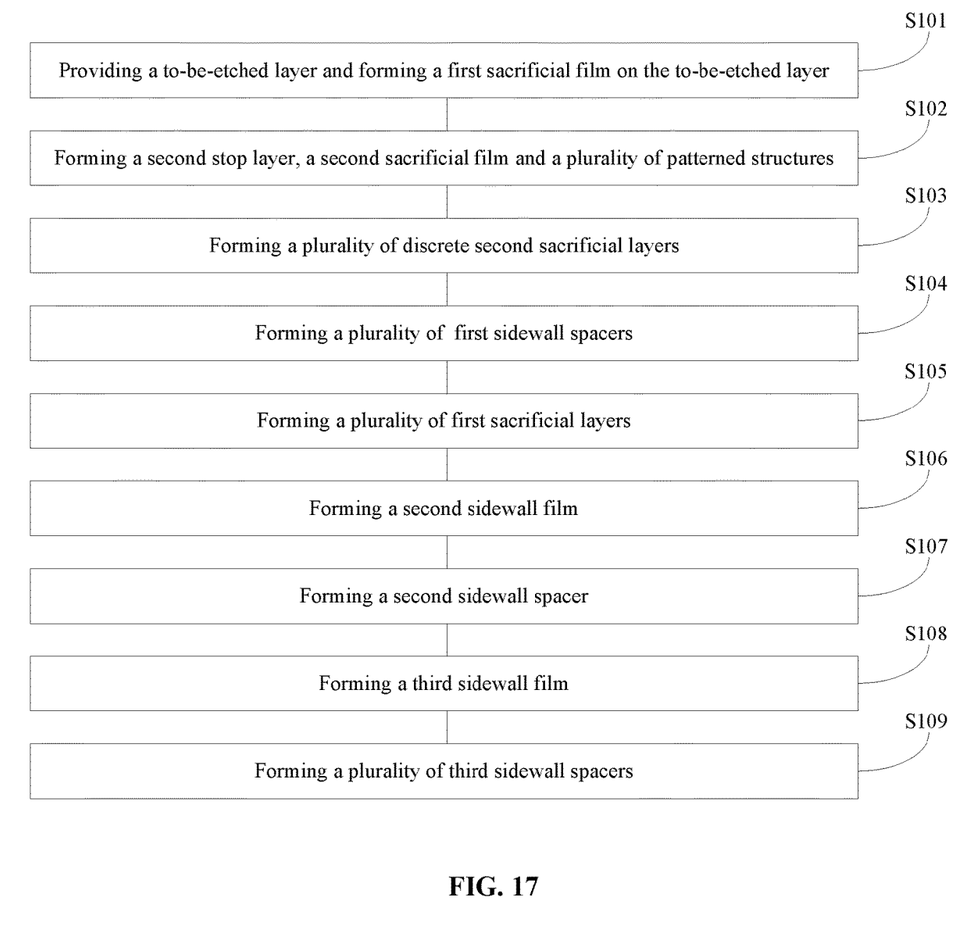
FIG. 17 illustrates an exemplary fabrication process of a semiconductor structure consistent with various disclosed embodiments of the present disclosure.

FIG. 17 illustrates an exemplary fabrication process of a semiconductor structure consistent with various disclosed embodiments of the present disclosure. FIGS. 5-16 illustrate structures corresponding to certain stages during the exemplary fabrication process.

Figure 5:
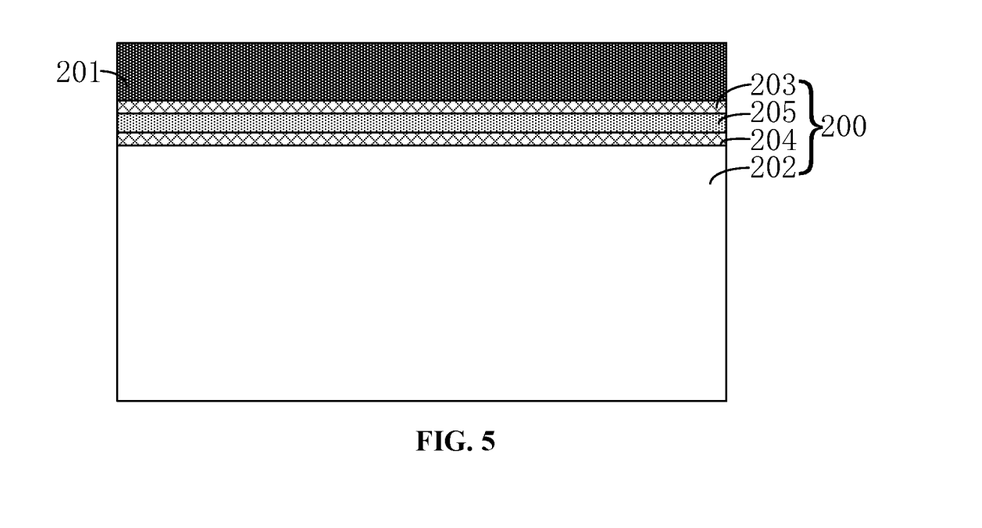
FIGS. 5-16 illustrate structures corresponding to certain stages during an exemplary fabrication process of a semiconductor structure consistent with various disclosed embodiments of the present disclosure.

As shown in FIG. 17, at the beginning of the fabrication process, a to-be-etched layer with certain structures is provided (S101). FIG. 5 illustrates a corresponding structure.

As shown in FIG. 5, a to-be-etched layer 200 is provided. A first sacrificial film 201 may be formed on the to-be-etched layer 200.

In one embodiment, the to-be-etched layer 200 may include a multiple-layer structure. The to-be-etched layer 200 may include a substrate 202, a mask structure on the substrate 202, and a second stop layer 203 on the mask structure.

In one embodiment, the material of the substrate 202 may be silicon. In some embodiments, the material of the substrate may also be germanium, silicon germanium, silicon carbide, gallium arsenide, or indium gallium, etc.

In one embodiment, the mask structure may include a first mask layer 204 and a second mask layer 205 disposed on the first mask layer 204.

In one embodiment, the material of the first mask layer 204 is silicon oxide, and the material of the second mask layer 205 is silicon nitride.

In one embodiment, the material of the first sacrificial film 201 is amorphous silicon. In some embodiments, the material of the first sacrificial film may also be silicon nitride, silicon carbide, silicon carbonitride, silicon oxycarbonitride, silicon oxynitride, boron nitride, or boron carbonitride, etc.

Figure 6:
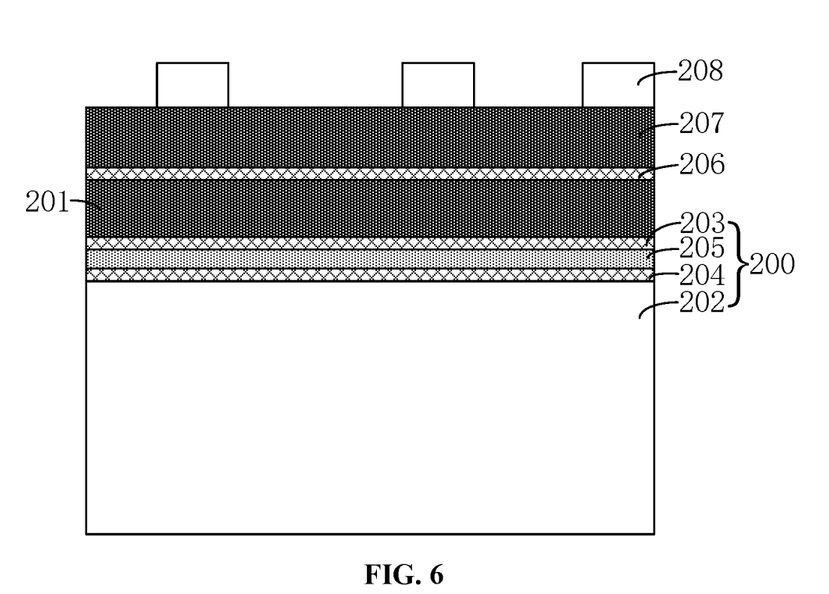
Figure 7:
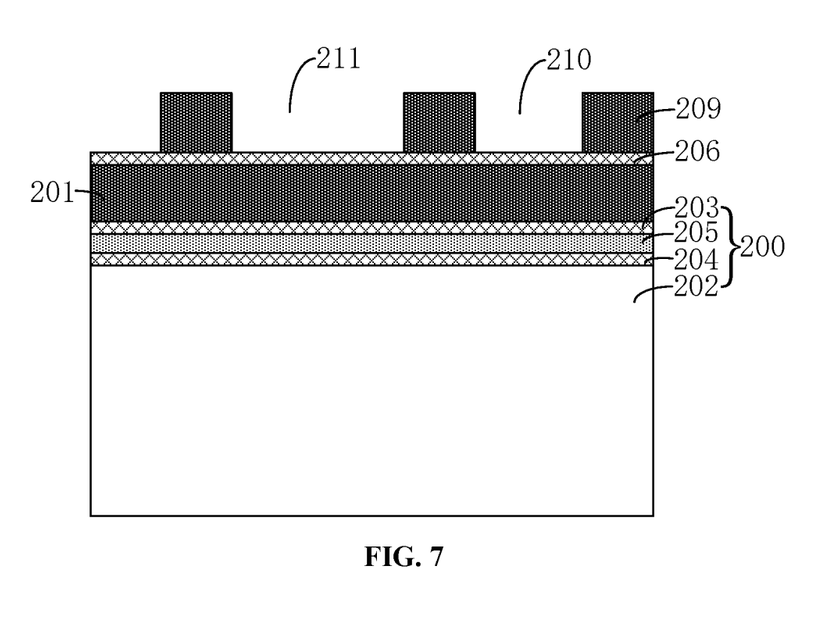

A plurality of discrete second sacrificial layers may be formed on the first sacrificial film 201, a first trench may be between adjacent second sacrificial layers, and a second trench may be between two adjacent second sacrificial layers. The width of the second trench may be greater than the width of the first trench. The width direction of the first trench and the width direction of the second trench may be consistent with the arrangement direction of the second sacrificial layers. FIGS. 6-7 illustrate structures corresponding to certain stages during the formation process of the second sacrificial layers.

Returning to FIG. 17, after forming the first sacrificial film, a second stop layer, a second sacrificial film and a plurality of discrete patterned structures may be formed (S102). FIG. 6 illustrates a corresponding structure.

As shown in FIG. 6, a second stop layer 206 may be formed on the first sacrificial film 201; a second sacrificial film 207 may be formed on the second stop layer 206; and a plurality of discrete patterned structures 208 may be formed on the second sacrificial film 207.

In one embodiment, the second stop layer 206 may function to stop the etching process when the second sacrificial film 207 is subsequently etched to prevent the etching process from continuing to damage the first sacrificial film 201.

In one embodiment, the material of the second stop layer 206 may be different from the material of the second sacrificial film 207. The purpose for using different materials for the second stop layer 206 and the second sacrificial film 207 may be to stop the subsequent process for etching the second sacrificial film 207 at the top surface of the second stop layer 206. The material of the second stop layer 206 may be silicon oxide.

In one embodiment, the material of the second sacrificial film 207 is amorphous silicon. In some embodiments, the material of the first sacrificial film may also be silicon nitride, silicon carbide, silicon carbonitride, silicon oxycarbonitride, silicon oxynitride, boron nitride, or boron carbonitride, etc.

In one embodiment, the material of the patterned structures 208 is photoresist.

Returning to FIG. 17, after forming the plurality of patterned structures, a plurality of discrete second sacrificial layers may be formed (S103). FIG. 7 illustrates a corresponding structure.

As shown in FIG. 7, the second sacrificial film 207 may be etched using the plurality of patterned structures 208 as an etching mask until the second stop layer 206 is exposed to form a plurality of discrete second sacrificial layers 209. There may be a first trench 210 between adjacent second sacrificial layers 209, and there may be a second trench 211 between adjacent second sacrificial layers 209. The width of the second trench 211 may be greater than the width of the first trench 210. The width direction of the first trench 210 and the width direction of the second trench 211 may be same as the arrangement direction of the plurality of second sacrificial layers 209. After forming the second sacrificial layers 209, the plurality of patterned structures 208 may be removed.

The process for forming the plurality of patterned structures 208 may include a photolithography patterning process. The process for removing the plurality of patterned structures 208 may include a wet stripping process, or an ashing process, etc.

In one embodiment, the process for removing the plurality of patterned structures 208 is an ashing process. The gas of the ashing process may be an oxygen-containing gas, such as oxygen, or ozone, etc.

Figure 8:
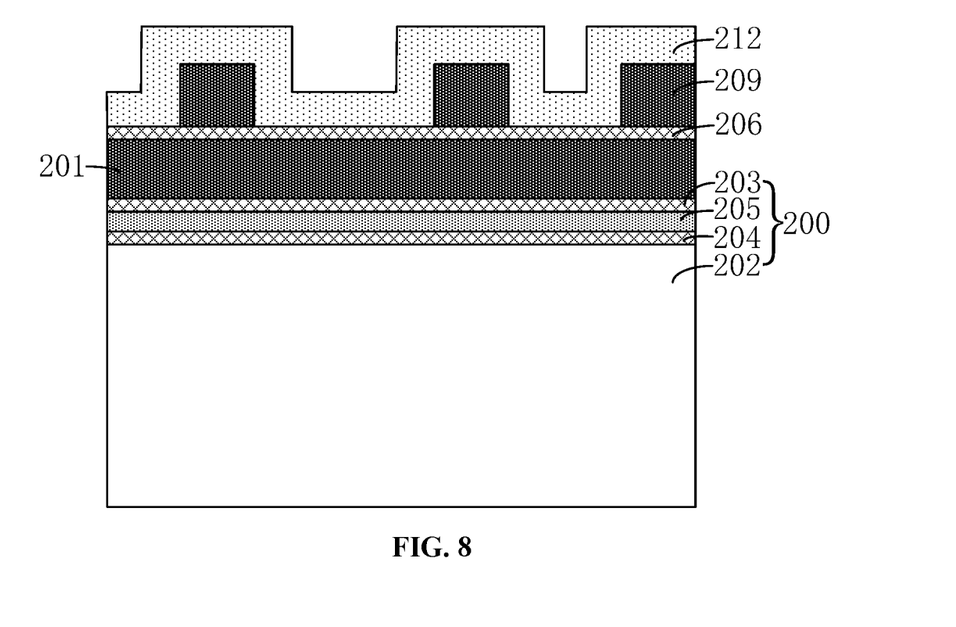
Figure 9:
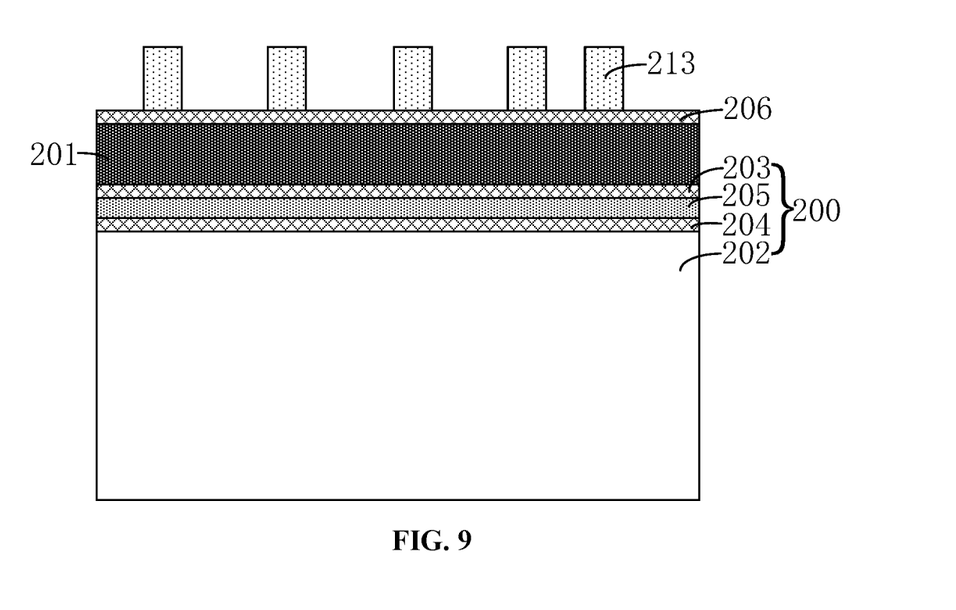

After removing the plurality of patterned structures 208, a first sidewall spacer may be formed on the sidewall surface of the second sacrificial layer 209. The ratio between the width of the first trench 210 and the thickness of the first sidewall spacer may be greater than 2:1. FIGS. 8-9 illustrate structures corresponding certain stages during the process for forming the first sidewall spacer.

Referring to FIG. 8, a first sidewall film 212 may be formed on the exposed portions of the top surface of the second stop layer 206 and the sidewall surfaces and top surfaces of the second sacrificial layers 209.

In one embodiment, the formation process of the first sidewall film 212 may include an atomic layer deposition (ALD) process, and the first sidewall film 212 formed by the ALD process may have a better step coverage, and the deposited thickness of the first sidewall film 212 may be more uniform and easy to control.

The material of the first sidewall film 212 may include silicon nitride or silicon oxynitride. In one embodiment, the material of the first sidewall film 212 is silicon nitride.

Returning to FIG. 17, after forming the first sidewall film, a plurality of first sidewall spacers may be formed (S104). FIG. 9 illustrates a corresponding structure.

As shown in FIG. 9, the first sidewall film 212 on the top surface of the second stop layer 206 and the top surfaces of the second sacrificial layers 209 may be etched back until the top surface of the second stop layer 206 and the top surfaces of the second sacrificial layers 209 are exposed to form a plurality of first sidewall spacers 213. After forming the first sidewall spacers 213, the second sacrificial layers 209 may be removed.

In one embodiment, by setting the width of the first trench 210 to be greater than twice the thickness of the first sidewall spacer 213 to increase the width of the first trench 210, the difference between the width of the first trench 210 and the width of the second trench 211 may be reduced. Thus, the requirements for the process of forming the second sacrificial layers 209 may be reduced; the process steps may be simplified; and the production efficiency may be improved.

The process used for etching-back the first sidewall film 212 may include an anisotropic dry etching process, or an anisotropic wet etching process, etc.

In one embodiment, the process used to etch-back the first sidewall film 212 is an anisotropic dry etching. The etching gases may include one or more of fluorine-containing gases, such as $CF_4$, $CHF_3$, or $C_2F_6$, etc.

Figure 10:
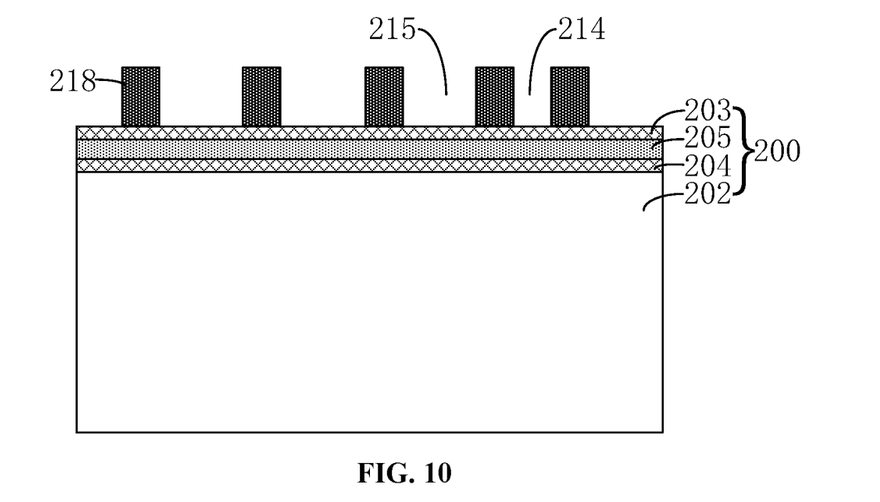

Returning to FIG. 17, after forming the plurality of first sidewall spacers, a plurality of first sacrificial layers may be formed (S105). FIG. 10 illustrates a corresponding structure.

As shown in FIG. 10, the first sacrificial film 201 may be etched using the plurality of first sidewall spacers 213 as an etching mask to form a plurality of first sacrificial layers 218 that may be discrete to each other. There may be a third trench 214 between adjacent first sacrificial layers 218; and there may be a fourth trench 215 between adjacent first sacrificial layers 218. The width of the fourth trench 215 may be greater than the width of the third trench 214. The width direction of the third trench 214 and the width direction of the fourth trench 215 may be consistent with the arrangement direction of the first sacrificial layers 218.

In one embodiment, when the first sacrificial film 201 is etched using the first sidewall spacers 213 as an etching mask, the second stop layer 206 on the first sacrificial film 201 may also be etched.

By using the first sidewall spacers 213 as the etching mask to etch the first sacrificial film 201 to form the first sacrificial layers 218, the pattern transfer may be completed in time to avoid the subsequent formation of second sidewall spacers on the second stop layer 206. The number of etching processes on the surface of the second stop layer 206 may be reduced. Accordingly, the damage to the second stop layer 206 and the first sacrificial film 201 may be reduced, and the morphology and dimensional accuracy of the structures formed in the subsequent pattern transfer process may be improved.

In one embodiment, the material of the first stop layer 203 may be different from the material of the first sacrificial film 201. Thus, the etching process of the first sacrificial film 201 may be stop at the first stop layer 203. In particular, the material of the first stop layer 203 may be silicon oxide.

In one embodiment, the material of the first sacrificial film 201 is amorphous silicon. In some embodiments, the material of the first sacrificial film may also be silicon nitride, silicon carbide, silicon carbonitride, silicon oxycarbonitride, silicon oxynitride, boron nitride, or boron carbonitride, etc.

Figure 11:
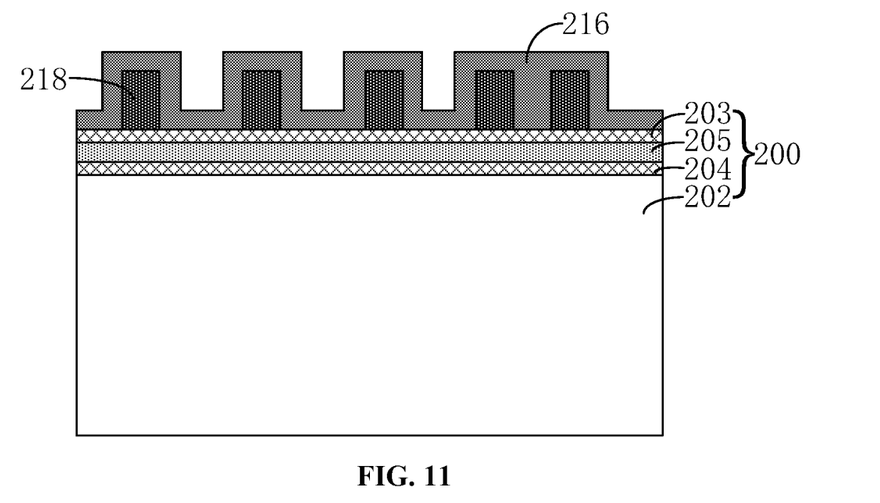
Figure 12:
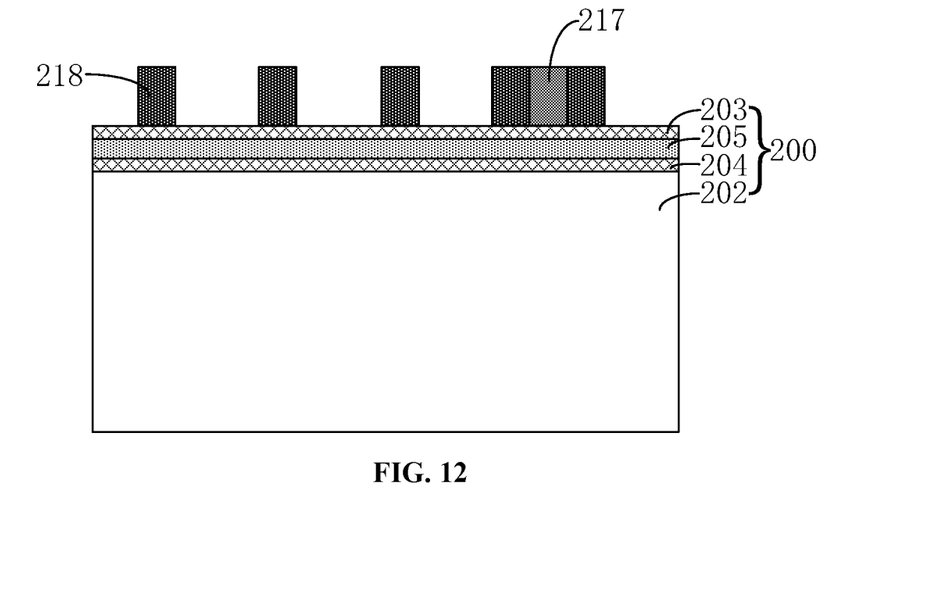

In one embodiment, after forming the first sacrificial layers 218, a second sidewall spacer may be formed in the third trench 214. The second sidewall spacer may fill the third trench 214. FIGS. 11-12 illustrate structures corresponding to certain stages during the process for forming the second sidewall spacer.

Returning to FIG. 17, after forming the first sacrificial layers, a second sidewall film may be formed (S106). FIG. 11 illustrates a corresponding structure.

As shown in FIG. 11, a second sidewall film 216 may be formed on the exposed portions of the top surface of the to-be-etched layer 200 and the sidewall surfaces and the top surfaces of the first sacrificial layers 218.

In one embodiment, the formation process of the second sidewall film 216 may include an atomic layer deposition process.

In one embodiment, the material of the second sidewall film 216 may be different from the material of the first sacrificial film 201, and the purpose may be to prevent the subsequent etching process of the second sidewall film 216 from damaging the first sacrificial layers. In particular, the material of the second sidewall film 216 may be silicon carbonitride.

Returning to FIG. 17, after forming the second sacrificial film, a second sidewall spacer may be formed (S107). FIG. 12 illustrates a corresponding structure.

As shown in FIG. 12, the second sidewall film 216 on the surfaces of the fourth trenches 215 and on the top surfaces of the first sacrificial layers 218 may be etched until the top surface of the to-be-etched layer 200 is exposed to form a second sidewall spacer 217.

In one embodiment, the etching process of the second sidewall film 216 may be stopped on the surface of the first stop layer 203.

In one embodiment, the ratio between the width of the third trench 214 and the thickness of the second sidewall spacer 217 may be less than 2:1. The ratio between the width of the fourth trench 215 and the thickness of the second sidewall spacer 217 may be greater than 2:1.

By setting the width of the third trench 214 to be less than twice the thickness of the second sidewall spacer 217, while the width of the fourth trench 215 may be set to be greater than twice the thickness of the second sidewall spacer 217, it may be ensured that, after the second sidewall film 216 is etched, the formed second sidewall spacer 217 may fill the third trench 214 without being formed in the fourth trench 215. Accordingly, the second sidewall spacer 217 may be merged with the second sacrificial layers 218 at both sides of the third trench 214. In the subsequent pattern transfer process, the portion of the to-be-etched layer 200 corresponding to the merged second sacrificial layers 218 and the second sidewall spacer 217 may not form a fin. Thus, the requirements for forming fins with different densities may be met.

The process used to etch the second sidewall film 216 may include an isotropic dry etching process, or an isotropic wet etching process, etc. The isotropic etching process may ensure the second sidewall spacer 217 to be only formed in the third trench 214 but not be formed in the fourth trench 215.

In one embodiment, the process used for etching the second sidewall film 216 may include an isotropic dry etching process. The isotropic dry etching process may include following parameters. The flow rate of $CF_4$ may be in a range of approximately 50 sccm-500 sccm. The flow rate of $CHF_3$ may be in a range of approximately 0 sccm-200 sccm. The flow rate of $O_2$ may be in range of approximately 0 sccm-100 sccm. The flow rate of $N_2$ may be in a range of approximately 0 sccm-200 sccm.

Figure 13:
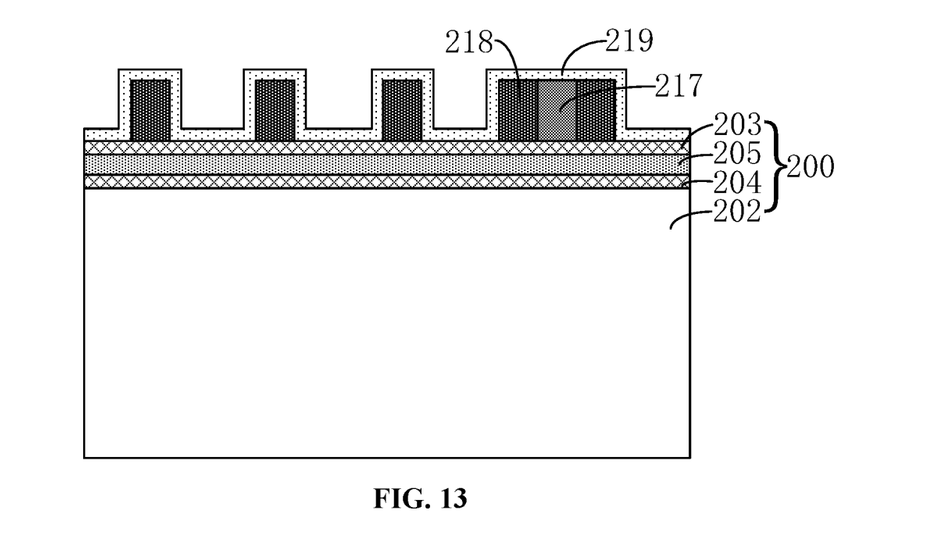
Figure 14:
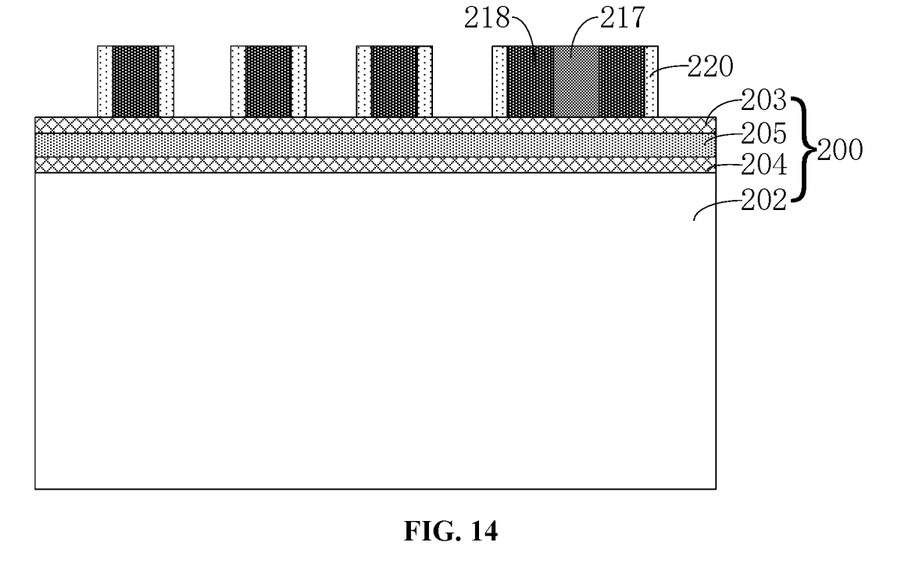

After forming the second sidewall spacer 217, third sidewall spacers may be formed on the sidewall surfaces of the first sacrificial layers 218. FIGS. 13-14 illustrate structures corresponding to certain stages during the fabrication process of the third sidewall spacers.

Returning to FIG. 17, after forming the second sidewall spacer, a third sidewall film may be formed (108). FIG. 13 illustrates a corresponding structure.

As shown in FIG. 13, a third sidewall film 219 may be formed on the exposed portions of the top surface of the to-be-etched layer 200, the sidewall surfaces and top surfaces of the first sacrificial layers 218, and the top surface of the second sidewall spacer 217.

In one embodiment, the formation process of the third sidewall film 219 may include an atomic layer deposition process.

Returning to FIG. 17, after forming the third sidewall film, a plurality of third sidewall spacers may be formed (S109). FIG. 14 illustrates a corresponding structure.

As shown in FIG. 14, the third sidewall film 219 on the exposed portions of the top surface of the to-be-etched layer 200, the top surfaces of the first sacrificial layers 218 and the top surface of the second sidewall spacer 217 may be etched back to form a plurality of third sidewall spacers 220. In particular, one third sidewall spacer 220 may be formed on one sidewall surface of one first sacrificial layer 218

In one embodiment, the etching-back process of the third sidewall film 219 may be stopped at the first stop layer 203. Thus, the material of the first stop layer 203 may be different from the material of the third sidewall film 219. In particular, the material of the third sidewall film 219 may be silicon nitride.

The process used to etch-back the third sidewall film 219 may include an anisotropic dry etching process, or an anisotropic wet etching process, etc. In one embodiment, the process used to etch-back the third sidewall film 219 is an anisotropic dry etching process.

Figure 15:
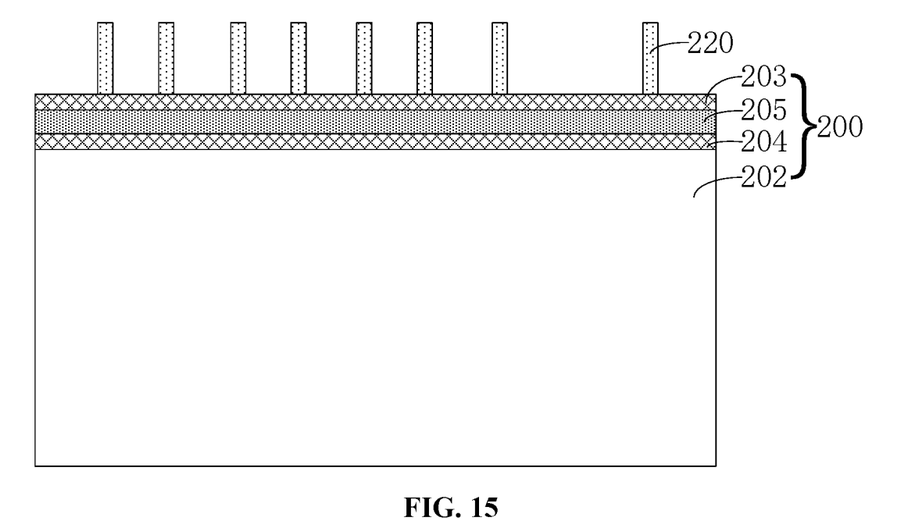

Further, as shown in FIG. 15, after forming the plurality of third sidewall spacers 220, the first sacrificial layers 218 and the second sidewall spacer 217 may be removed.

Further, as shown in FIG. 16, after removing the first sacrificial layers 218 and the second sidewall spacer 217, the third sidewall spacers 220 may be used as an etching mask to etch the to-be-etched layer 200 to form a plurality of fins 221 discrete to each other.

In one embodiment, the plurality of fins 221 may be formed in the substrate 202; and may be used for the subsequent fabrication of semiconductor devices.

The fins 221 formed by an etching process using the third sidewall spacers 220 as an etching mask may have different spacings to meet the requirements for subsequently forming semiconductor devices.

In one embodiment, referring to FIG. 16, after forming the plurality of fins 221, the third sidewall spacers 220, the first stop layer 203, and the mask structure may be removed.

The present disclosure also provides a semiconductor structure. FIG. 14 illustrates a corresponding structure.

As shown in FIG. 14, the semiconductor structure includes a to-be-etched layer 200 and a plurality of first sacrificial layers 218 formed on the to-be-etched layer 200. The semiconductor structure may also include a plurality of third sidewall spacers 220 formed on the sidewall surfaces of the first sacrificial layers 218. Further, the semiconductor may include a second sidewall spacer 217 between adjacent first sacrificial layers 218. The to-be-etched layer 200 may include a substrate 202, a mask structure including a first mask layer 204 and a second mask layer 205 on the substrate 202, and a first stop layer 203 on the mask structure. The detailed structures and intermediate structures are described above with respect to the fabrication processes.

The technical solutions of the present disclosure may have at least the following beneficial effects.

In the disclosed fabrication method, a ratio between the width of the first trench and the thickness of the first sidewall spacer may be greater than 2:1. The width of the first trench may be increased to decrease the width difference between the first trench and the second trench. Accordingly, the process requirement for forming the second sacrificial layers may be reduced; and the fabrication process may be simplified; and the production efficiency may be improved. By subsequently using the second sidewall spacer to fill the third trench and not to fill the fourth trenches, the requirements for forming fins with different densities may be met.

Further, in the present disclosure, the third sidewall spacers may be used as an etching mask to etch the to-be-etched layer to form the plurality of fins. The plurality of fins may be subsequently used to form semiconductor devices.

The above detailed descriptions only illustrate certain exemplary embodiments of the present disclosure, and are not intended to limit the scope of the present disclosure. Those skilled in the art can understand the specification as whole and technical features in the various embodiments can be combined into other embodiments understandable to those persons of ordinary skill in the art. Any equivalent or modification thereof, without departing from the spirit and principle of the present disclosure, falls within the true scope of the present disclosure.

What is claimed is:

1. A method for forming a semiconductor device, comprising:
   providing a to-be-etched layer;
   forming a first sacrificial film on the to-be-etched layer;
   forming a plurality of second sacrificial layers discrete to each other on the first sacrificial film, wherein a first trench is between adjacent second sacrificial layers of the plurality of second sacrificial layers, a second trench is between other adjacent second sacrificial layers of the plurality of second sacrificial layers, a width of the second trench is greater than a width of the first trench, and a width direction of the first trench and a width direction of the second trench are consistent with an arrangement direction of the plurality of second sacrificial layers;
   forming a first sidewall spacer on a sidewall surface of a second sacrificial layer of the plurality of second sacrificial layers, wherein a ratio between the width of the first trench and a thickness of the first sidewall spacer is greater than 2:1;
   removing the plurality of second sacrificial layers;
   etching the first sacrificial film using the first sidewall spacer as an etching mask to form a plurality of first sacrificial layers discrete to each other, wherein a third trench is between adjacent first sacrificial layers of the plurality of first sacrificial layers, a fourth trench is between other adjacent first sacrificial layers of the plurality of first sacrificial layers, a width of the fourth trench is greater than a width of the third trench, and a width direction of the third trench and a width direction of the fourth trench are consistent with an arrangement direction of the plurality of first sacrificial layers;
   forming a second sidewall spacer in the third trench to fill the third trench; and
   forming third sidewall spacers on sidewall surfaces of the plurality of first sacrificial layers.

2. The method according to claim 1, wherein:
   the to-be-etched layer includes a multiple-layer structure, the multiple-layer structure including a substrate, a mask structure on the substrate and a first stop layer on the mask structure.

3. The method according to claim 1, wherein forming the plurality of second sacrificial layers comprises:
   forming a second stop layer on the first sacrificial film;
   forming a second sacrificial film on the second stop layer;
   forming a plurality of patterned structures discrete to each other on the second sacrificial film;

etching the second sacrificial film using the plurality of patterned structures as an etching mask until the second stop layer is exposed to form the plurality of second sacrificial layers; and removing the plurality of patterned structures after forming the plurality of second sacrificial layers.

4. The method according to claim 3, wherein forming the first sidewall spacer comprises:

forming a first sidewall film on exposed portions of a top surface of the second stop layer, and sidewall surfaces and top surfaces of the plurality of second sacrificial layers; and etching-back the first sidewall film on the exposed portions of the top surface of the second stop layer and the top surfaces of the plurality of second sacrificial layers until the exposed portions of the top surface of the second stop layer and the top surfaces of the plurality of second sacrificial layers are exposed to form the first sidewall spacer.

5. The method according to claim 4, wherein:

forming the first sidewall film includes an atomic layer deposition process.

6. The method according to claim 4, wherein:

etching-back the first sidewall film includes one or more of an anisotropic dry etching process and an anisotropic wet etching process.

7. The method according to claim 4, wherein:

a material of the first sidewall film includes one of silicon nitride and silicon oxynitride.

8. The method according to claim 1, wherein forming the second sidewall spacer comprises:

forming a second sidewall film on exposed portions of a top surface of the to-be-etched layer and sidewall surfaces and top surfaces of the plurality of first sacrificial layers; and etching the second sidewall film on a surface of the fourth trench and the top surfaces of the plurality of first sacrificial layers until the exposed portions of the top surface of the to-be-etched layer and the top surface of the plurality of first sacrificial layers are exposed to form the second sidewall spacer.

9. The method according to claim 1, wherein:

a ratio between the width of the third trench and a thickness of the second sidewall spacer is smaller than 2:1; and a ratio between the width of the fourth trench and the thickness of the second sidewall spacer is greater than 2:1.

10. The method according to claim 8, wherein:

forming the second sidewall film includes an atomic layer deposition process.

11. The method according to claim 8, wherein:

etching the second sidewall film includes one or more of an isotropic dry etching process and an isotropic wet etching process.

12. The method according to claim 8, wherein:

a material of the second sidewall film includes silicon carbonitride.

13. The method according to claim 1, wherein forming the third sidewall spacers comprises:

forming a third sidewall film on exposed portions of a top surface of the to-be-etched layer, top surfaces and the sidewall surfaces of the plurality of first sacrificial layers and a top surface of the second sidewall spacer;

etching-back the third sidewall film on the exposed portions of the top surface of the to-be-etched layer, the top surfaces of the plurality of first sacrificial layers and the top surface of the second sidewall spacer to form the third sidewall spacers; and removing the plurality of first sacrificial layers and the second sidewall spacer after forming the third sidewall spacers.

14. The method according to claim 13, wherein:

forming the third sidewall film includes an atomic layer deposition process.

15. The method according to claim 13, wherein:

a material of the third sidewall film includes one of silicon nitride and silicon oxynitride.

16. The method according to claim 13, wherein:

etching-back the third sidewall film includes one or more of an anisotropic dry etching process and an isotropic wet etching process.

17. The method according to claim 13, after forming the third sidewall spacers, further comprising:

etching the to-be-etched layer using the third sidewall spacers as an etching mask to form a plurality of fins discrete to each other.

18. A semiconductor structure, formed by the method according to claim 1.

* * * * *